(12) United States Patent
Koehler et al.

(10) Patent No.: US 11,307,523 B2
(45) Date of Patent: Apr. 19, 2022

(54) DETERMINATIONS OF FAILURE CONDITIONS BASED ON POWER CONSUMPTIONS

(71) Applicant: Hewlett-Packard Development Company, L.P., Spring, TX (US)

(72) Inventors: Duane A. Koehler, Vancouver, WA (US); Robert Yraceburu, Vancouver, WA (US)

(73) Assignee: Hewlett-Packard Development Company, L.P., Spring, TX (US)

(*) Notice: Subject to any disclaimer, the term of this patent is extended or adjusted under 35 U.S.C. 154(b) by 0 days.

(21) Appl. No.: 17/288,529

(22) PCT Filed: Apr. 30, 2019

(86) PCT No.: PCT/US2019/030055
§ 371 (c)(1),
(2) Date: Apr. 24, 2021

(87) PCT Pub. No.: WO2020/222830
PCT Pub. Date: Nov. 5, 2020

(65) Prior Publication Data
US 2022/0050409 A1 Feb. 17, 2022

(51) Int. Cl.
*G03G 15/20* (2006.01)
*G03G 15/00* (2006.01)

(52) U.S. Cl.
CPC ..... *G03G 15/2053* (2013.01); *G03G 15/2098* (2021.01); *G03G 15/5004* (2013.01); *G03G 15/5037* (2013.01); *G03G 15/55* (2013.01); *G03G 15/80* (2013.01)

(58) Field of Classification Search
CPC ........................... G03G 15/5004; G03G 15/55
See application file for complete search history.

(56) References Cited

U.S. PATENT DOCUMENTS

| | | |
|---|---|---|
| 8,112,010 B2 | 2/2012 | Yoshimoto |
| 10,001,732 B2 | 6/2018 | Cao et al. |
| 2005/0231538 A1 | 10/2005 | Deng |
| 2005/0240376 A1 | 10/2005 | Uwatoko et al. |
| 2008/0010522 A1 | 1/2008 | Uwatoko et al. |
| 2008/0174644 A1 | 7/2008 | Hongo et al. |
| 2008/0174655 A1 | 7/2008 | Matsui |
| 2015/0336398 A1 | 11/2015 | Bucks et al. |

FOREIGN PATENT DOCUMENTS

| | | |
|---|---|---|
| JP | 2006044027 | 2/2006 |
| WO | WO-2012010879 | 1/2012 |

*Primary Examiner* — Arlene Heredia
(74) *Attorney, Agent, or Firm* — HP Inc. Patent Department

(57) ABSTRACT

A volt meter and a current meter may measure a voltage and a current for the calculation of power consumption. A controller may calculate the power consumption when a heating element is activated and when the heating element is deactivated. Based on the power consumptions when the heating element is activated or deactivated, a failure condition may be determined.

15 Claims, 3 Drawing Sheets

DETERMINATIONS OF FAILURE CONDITIONS BASED ON POWER CONSUMPTIONS

BACKGROUND

A heating element may be used as part of a printer. Heat may be applied to transfer dye from one medium to another, to evaporate moisture from ink or paper, or to melt a printing medium, such as the case with 3D printers. Multiple heating elements may be used, along with peripheral components, to provide power to and control the heating of the elements at the proper time.

BRIEF DESCRIPTION OF THE DRAWINGS

Various examples will be described below referring to the following figures.

DETAILED DESCRIPTION

Printers, such as dye sublimation printers, inkjet printers, laser printers, electrophotographic printers, Z-ink printers, or 3D printers, may use heating elements as part of the printing process. Failure or degradation of an individual heating element or other component of the printer may be difficult to diagnose. The printer may still operate, but at reduced efficiency.

As a heating element, or other elements of the printer, degrade or fail, their power consumption may change. For example, a heating element may be a resistive element, such as a filament that changes electricity into heat. If the filament breaks, the heating element may no longer draw power when activated. Selectively activating various components of the printer and measuring the change in power consumption may provide useful diagnostics to determine whether a component has failed or has degraded.

Figure 1:
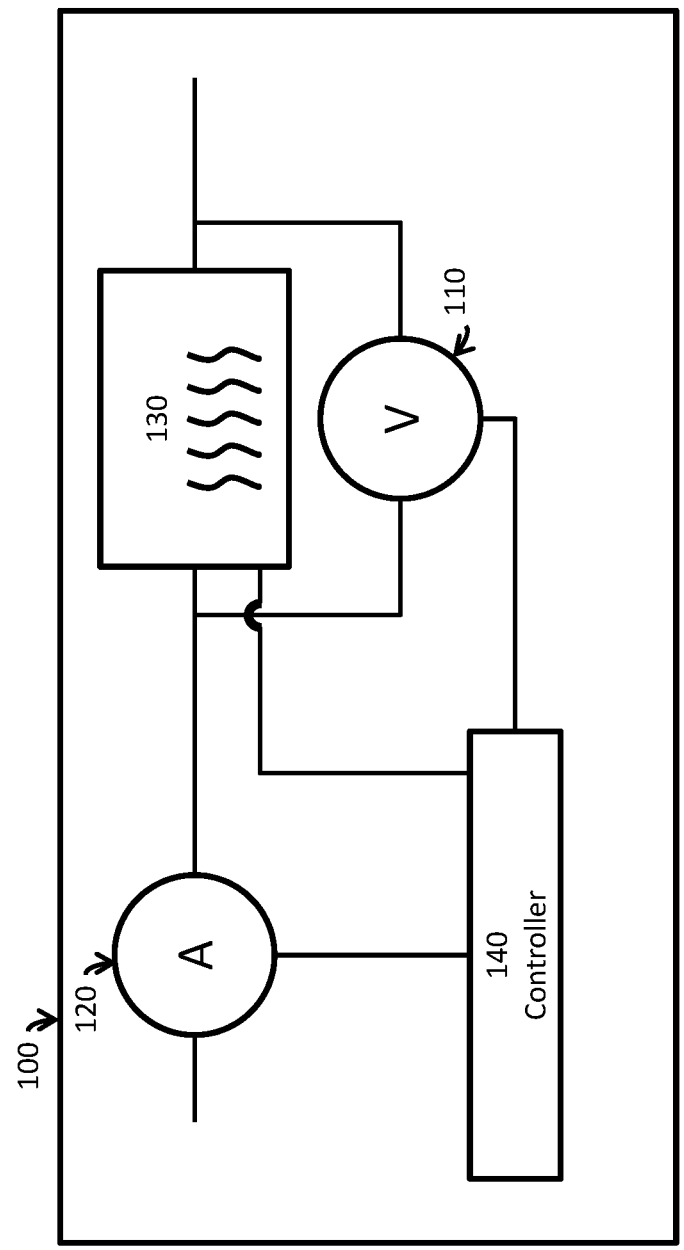
FIG. 1 shows an apparatus with a current meter, a volt meter, a controller, and a heating element in accordance with various examples.

FIG. 1 shows an apparatus 100 with a current meter 120, a volt meter 110, a controller 140, and a heating element 130 in accordance with various examples. The current meter 120 and the volt meter 110 may be coupled to the heating element 130 in a way to calculate a power draw of the heating element 130. The current meter 120 and the volt meter 110 may be coupled to the controller 140. The controller 140 may be coupled to the heating element 130.

The controller 140 may comprise a microprocessor, a microcomputer, a microcontroller, a field programmable gate array (FPGA), or discrete logic. The controller 140 may execute machine-readable instructions that implement the methods described herein, such as the method described in connection with FIG. 3. The machine-readable instructions may be stored in a memory in the apparatus 100. The controller 140 may calculate a power consumption based on measurements from the volt meter 110 and the current meter 120.

The heating element 130 may be various types of heating elements. A heating element may generate heat by passing electricity through a resistive element, thereby generating heat. A heating element may include a halogen lamp, a resistive wire such as nichrome, a ceramic heater plate, or a power semiconductor.

The volt meter 110 and current meter 120 may be used to determine power supplied to various components. While the configuration depicted here may determine power supplied to the heating element 130, additional components may be included in the path and the combined power supplied to the heating element 130 and additional components may be calculated. For example, the volt meter 110 and current meter 120 may be used to measure power consumption of the entire apparatus 100, including any power consumption by the controller 140 and the volt meter 110 and current meter 120.

The controller 140 may receive measurements from the volt meter 110 and the current meter 120 and use the measurements to calculate a power consumption. The controller 140 may calculate a power consumption while the heating element 130 is in a deactivated state. The controller 140 may activate the heating element 130 without modifying the state of other components of the apparatus 100. The controller 140 may then calculate the power consumption with the heating element 130 in an activated state. The controller 140 may compare the power consumption while the heating element 130 is activated and deactivated and determine a failure condition.

The failure condition may indicate the condition of a component and encompass multiple different conditions of a component. A failure condition of a component may be that it is operating normally, and there is no failure. A failure condition may include a total failure or a partial failure. Depending on the component, there may be other specific failure conditions that may be identifiable. For example, one failure condition may be a break in the circuit. Another failure condition may be a short circuit. Another failure condition may be that a relay has begun to be corroded. The efficiency of the relay may be adversely affected, even if it may still be operating within acceptable parameters. Detection of failure conditions may cause an alert to be provided to a user or may be logged to a log file.

In various examples, the controller 140 may be able to selectively control various components in the apparatus. The controller 140 may be able to set up one state of the apparatus where the heating element 130 is deactivated and another state where the heating element 130 is activated, thereby isolating the effects of the activation of the heating element 130 on the power consumption. If the difference in power consumption is negligible or significantly different than expected, it may indicate that the heating element has failed, such as if a filament of the heating element 130 has broken. The heating element 130 may have various activated states. The activated states may differ in the amount of voltage or current supplied to the heating element 130 or in a number of filaments used for a multi-filament heating element. The controller 140 may place the heating element 130 in its various activated states, measuring their respective power consumptions. This may be useful in determining a partial failure of the heating element. The power consumption may also indicate that an incorrect component has been installed. For example, if the heating element 130 is replaceable, the incorrect heating element 130 may be in use. The power consumption may be used to identify that a heating element 130 of an incorrect wattage may be installed in the apparatus 100.

In various examples, multiple heating elements may be present in the apparatus 100. The controller 140 may measure a power consumption with the heating elements deactivated. The controller 140 may then activate one heating element 130 and measure the power consumption. The controller 140 may activate a second heating element, either deactivating the first heating element 130 or leaving it activated. The controller 140 may then measure power consumption again and compare it with the prior power consumption measurements.

In various examples, the controller may determine a failure condition of a component other than the heating element 130. A relay, triode for alternating current (TRIAC), or power switching device may provide power to a pair of heating elements. The device may be able to provide full power to a single heating element, but have a failure condition when it cannot provide full power to both heating elements. The controller 140 may be able to determine that the individual activation of the heating elements operates normally, but that less power is consumed when both heating elements are activated at the same time. The controller 140 may thus determine that there is an issue with another component of the apparatus 100. Depending on the design of the apparatus 100 and what components may be selectively controlled, the controller 140 may be able to determine that a relay or other power switching circuit device is having issues, or it may just be able to determine there is a failure somewhere along the electrical path to provide power to the pair of heating elements.

In various examples, the controller 140 may determine the presence of a short circuit or a broken circuit. As the controller 140 selectively activates various components, it may compare the power consumption against a range of expected power consumption. If the controller 140 determines that more power is being consumed than expected, this may be indicative of a short circuit. If less power is being consumed than expected, this may be indicative of a broken circuit. Determination of a short circuit or a broken circuit may also be one of a degree of the difference in power consumption. Consuming a relatively small amount of power greater than expected may be indicative that a filament is thinning and may soon fail. Once the filament fails, it may break and then consume a lot less power. A short circuit may consume a relatively greater amount of power. The controller 140 may thus have various ranges of power consumption that may indicate different failure conditions.

In various examples, the heating element 130 may be expected to wear out over time. The power consumption of the heating element 130 may increase or decrease as part of this wear. The controller 140 may evaluate the power consumption of the heating element 130 in light of expected wear. This may involve tracking the total number of pages printed, total hours of operation of the heating element 130, ambient temperature, or other factors. The controller 140 may determine where the heating element 130 is within the wear out cycle and predict when it may need to be replaced. The controller 140 may adjust the expected ranges of power consumption indicating various failure conditions based on the wear out factors.

In various examples, the apparatus 100 may include a memory to store the calculated power consumptions. This may allow controller 140 to access prior power consumption calculations to diagnose failure conditions. As a component fails over time, its power consumption may change. Some failure conditions may be indicated by a gradual increase or decrease in power consumption. A thinning filament may be indicated by a gradual decrease in power. Some failure conditions may be indicated by a widely varying power consumption. If a wire or other electrical connection is loose, the power consumption may vary over time based on vibrations or other movements that jostle the wire from one recordation of power consumption to another.

In various examples, the controller 140 may perform the selective activation and analysis of power consumption during a diagnostic sequence. The diagnostic sequence may be activated on startup or shutdown of the apparatus 100, or as part of a self-check by the apparatus 100. Depending on the operation of the apparatus 100, the controller 140 may be able to determine some fault conditions of components during normal use of the apparatus 100. The controller 140 may be able to record the activation state of various components and the power consumption and over time approximate the power consumption of individual components.

Figure 2:
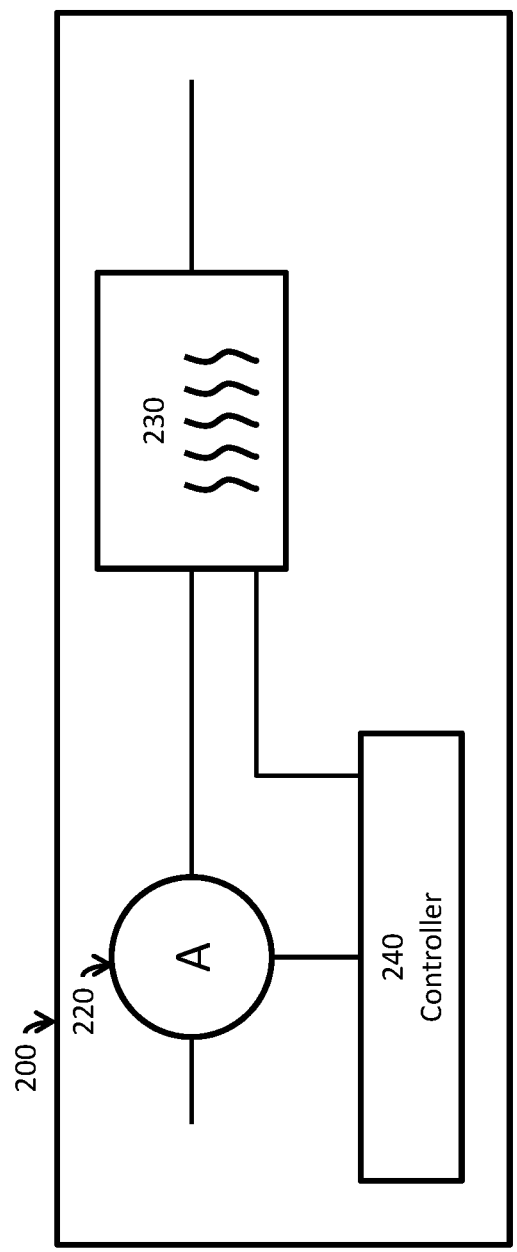
FIG. 2 shows an apparatus with a current meter, a controller, and a heating element in accordance with various examples.

FIG. 2 shows an apparatus 200 with a current meter 220, a controller 240, and a heating element 230 in accordance with various examples. The current meter 220 may be coupled as to measure the current supplied to heating element 230. Additional components may be present in the apparatus 200, with the current meter 220 measuring the current supplied to the collection of components. The controller 240 may be coupled to the current meter 220 and the heating element 230. The controller 240 may be able to selectively activate or deactivate the heating element 230. The controller 240 may receive current measurements from the current meter 220 in order to evaluate any change in the supplied current while the heating element 230 is in its various states.

In various examples, a current meter 220 may be sufficient to determine some failure conditions, even in the absence of a volt meter. The heating element 230 may include a filament that breaks and creates an open circuit on failure. The controller 240 may be able to determine that an open circuit exists in the heating element 230 based on a lack of increased current flow when the heating element 230 is activated. If the heating element 230 is susceptible to shorts, a significant rise in current flow may indicate a short in the heating element 230. For other failure conditions, use of both a current meter 220 and a volt meter (not shown) may provide the data to determine a fault condition.

Figure 3:
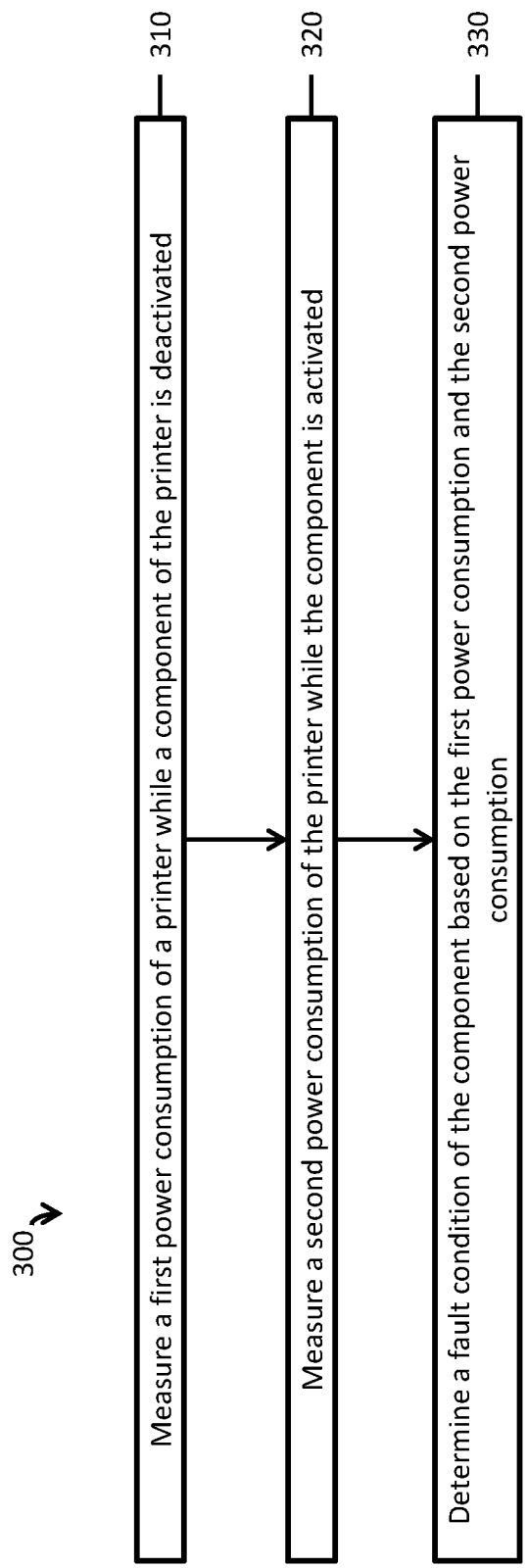
FIG. 3 shows a method of measuring power consumptions and determining a fault condition based on the power consumptions in accordance with various examples.

FIG. 3 shows a method 300 of measuring power consumptions and determining a fault condition based on the power consumptions in accordance with various examples. Method 300 includes measuring a first power consumption of a printer while a component of the printer is deactivated (310). Method 300 includes measuring a second power consumption of the printer while the component is activated (320). Method 300 includes determining a fault condition of the component based on the first power consumption and the second power consumption (330).

In various examples, the measuring and determining may be handled by a controller. The controller may be able to control the activation or deactivation of the component. The measuring of power consumption may include the use of a volt meter and a current meter. The measured power consumption may be the power consumption of the entire printer, as measured at the power input and return connections, or a subset of the consumed power. The subset of consumed power may be the direct current (DC) power provided by an internal power supply that changes alternating current (AC) power from a wall outlet into DC power to power the printer. The subset of consumed power may be the power provided to a set of heating elements.

The component may include a set of heating elements for the printer. Certain heating elements may be selectively activated, and the power consumption measured for those heating elements. This may include activating a single heating element and deactivating the other heating elements.

Single heating elements in the set of heating elements may thus be activated and their individual power consumption measured. The individual power consumptions may be used to determine a heating fault is present in the set of heating elements. The heating fault may be a heating element with a short or open circuit. The heating fault may be determined to be due to a relay or other power switching device that provides power to a certain bank of heating elements.

In various examples, determining a fault condition may involve comparing the ratio of power consumption across different components. One component may be designed to consume double the power of another component. If the ratio of power consumption deviates significantly from a 2:1 ratio, that may be indicative of a failure condition. Comparing the ratios may be useful when dealing with manufacturing tolerances of components or to account for local variations in the power supply or effects of other components in the system that have failed or are approaching failure.

In various examples, determining a fault condition may involve calculating a difference in power consumption when the component is activated versus deactivated. The difference may be compared against a predetermined value, which may be an expected power consumption for the component. If the difference is less than the expected power consumption, an error condition may be present in the component. Multiple predetermined values may be used to check if the power consumption difference is within an expected range, or how much the power consumption difference varies from the expected range. Different ranges of power consumption may indicate different failures or different severities of a failure. Comparing against a set of predetermined values may allow determining whether a first fault condition is present or a second, different fault condition is present.

In various examples, the power consumption may be recorded in a memory, recording how the power consumption of the component varies over time. A diagnostic routine may be performed on one day to record the first power consumption and the second power consumption of the component in the deactivated and activated states at a first time period. The diagnostic routine may be performed one month later to record a third power consumption and a fourth power consumption at a second time period. Based on changes in the power consumption from the first time period to the second time period, a failure condition may be determined.

The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications.

What is claimed is:

1. An apparatus comprising:
 a volt meter to measure a voltage;
 a current meter to measure a current;
 a heating element to apply heat; and
 a controller coupled to the volt meter, the current meter, and the heating element, wherein the controller is to:
  calculate a first power consumption with the heating element deactivated, the calculation of the first power consumption based on the volt meter and the current meter;
  calculate a second power consumption with the heating element activated, the calculation of the second power consumption based on the volt meter and the current meter; and
  determine a failure condition of the heating element based on the first power consumption and the second power consumption.

2. The apparatus of claim 1 comprising a second heating element, wherein the controller is to:
 calculate a third power consumption with the second heating element activated, the calculation of the third power consumption based on the volt meter and the current meter; and
 determine a second failure condition of the second heating element based on the third power consumption.

3. The apparatus of claim 1, wherein the first power consumption and the second power consumption are part of a set of power consumptions, and the controller is to determine a short condition based on the set of power consumptions.

4. The apparatus of claim 1 comprising:
 a memory; and
 a component, wherein the controller is to:
  calculate a third power consumption with the heating element deactivated, the calculation of the third power consumption based on the volt meter and the current meter;
  calculate a fourth power consumption with the heating element activated, the calculation of the fourth power consumption based on the volt meter and the current meter;
  store the first power consumption, the second power consumption, the third power consumption, and the fourth power consumption as a set of power consumptions in the memory;
  determine a second failure condition of the component based on the set of power consumptions.

5. The apparatus of claim 1, wherein the heating element includes a halogen lamp.

6. An apparatus comprising:
 a heating element to apply heat;
 a current meter coupled to the heating element, the current meter to measure a current supplied to the heating element; and
 a controller coupled to the current meter and the heating element, wherein the controller is to:
  compare an activated current value with a deactivated current value, the activated current value based on a measurement of the current meter while the heating element is activated, the deactivated current value based on a measurement of the current meter while the heating element is deactivated; and
  determine a failure condition of the heating element based on the comparison.

7. The apparatus of claim 6 comprising a volt meter coupled to the heating element, the volt meter to measure a voltage supplied to the heating element, wherein the comparison includes calculating an activated power value and a deactivated power value, the activated power value based on the activated current value and a measurement of the voltage meter while the heating element is activated, and the deactivated power value based on the deactivated current value and a measurement of the voltage meter while the heating element is deactivated.

8. The apparatus of claim 6, wherein the controller is to distinguish between a short associated with the heating element and an open circuit associated with the heating element based on the activated current value.

9. The apparatus of claim 6 comprising a memory to store the activated current value.

10. The apparatus of claim 9, wherein the controller is to evaluate a set of stored current values of the heating element, the set of stored current values stored in the memory, the set of stored current values based on a set of measurements of the current meter while the heating element is activated, and the determination of the failure condition based on the set of stored current values.

11. A method comprising:
measuring a first power consumption of a printer while a component of the printer is deactivated;
measuring a second power consumption of the printer while the component is activated; and
determining a fault condition of the component based on the first power consumption and the second power consumption.

12. The method of claim 11 comprising:
selectively activating heating elements in a set of heating elements of the printer;
measuring a set of power consumptions of the printer while different heating elements in the set of heating elements are in an activated state; and
determining a heating fault of a heating element in the set of heating elements based on the set of power consumptions.

13. The method of claim 11, wherein the determining the fault condition includes comparing a difference between the first power consumption and the second power consumption against a predetermined value, the predetermined value based on an expected power consumption of the component.

14. The method of claim 13, wherein the comparing includes comparing the difference against a set of predetermined values, and the determining the fault condition includes determining between a first fault condition and a second fault condition based on the comparing the difference against the set of predetermined values.

15. The method of claim 11 comprising:
storing the first power consumption and the second power consumption in a memory, the first power consumption and the second power consumption measured at a first time period;
measuring a third power consumption of the printer at a second time period while the component is deactivated, the first time period differing from the second time period;
measuring a fourth power consumption of the printer at the second time period while the component is activated; and
determining a second fault condition of the component based on the first power consumption, the second power consumption, the third power consumption, and the fourth power consumption.

* * * * *